US012419186B2

(12) United States Patent
Kim et al.

(10) Patent No.: US 12,419,186 B2
(45) Date of Patent: Sep. 16, 2025

(54) TRANSPARENT DISPLAY DEVICE

(71) Applicant: LG Display Co., Ltd., Seoul (KR)

(72) Inventors: TaeHan Kim, Paju-si (KR); DongHo Lee, Paju-si (KR); GeunGi Lee, Paju-si (KR); WooSang Kim, Paju-si (KR); JaeMin Shim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 486 days.

(21) Appl. No.: 18/057,677

(22) Filed: Nov. 21, 2022

(65) Prior Publication Data

US 2023/0200195 A1 Jun. 22, 2023

(30) Foreign Application Priority Data

Dec. 22, 2021 (KR) .................. 10-2021-0184768

(51) Int. Cl.
| | |
|---|---|
| *H10K 59/88* | (2023.01) |
| *H10K 50/86* | (2023.01) |
| *H10K 59/123* | (2023.01) |
| *H10K 59/131* | (2023.01) |
| *H10K 59/38* | (2023.01) |

(52) U.S. Cl.
CPC .......... *H10K 59/88* (2023.02); *H10K 50/865* (2023.02); *H10K 59/123* (2023.02); *H10K 59/131* (2023.02); *H10K 59/38* (2023.02)

(58) Field of Classification Search
CPC .... H10K 59/88; H10K 50/865; H10K 59/123; H10K 59/131; H10K 59/38; H10K 59/121; H10K 59/122; H10K 59/8792; H10K 71/861; H10K 59/35
See application file for complete search history.

(56) References Cited

U.S. PATENT DOCUMENTS

| | | | |
|---|---|---|---|
| 10,083,657 B2 | 9/2018 | Kim et al. | |
| 10,535,290 B2 | 1/2020 | Choi et al. | |
| 2006/0290277 A1 | 12/2006 | Takahashi et al. | |
| 2013/0048990 A1 | 2/2013 | Park et al. | |
| 2017/0193876 A1* | 7/2017 | Choi | H10K 59/131 |
| 2018/0076411 A1 | 3/2018 | Kim | |
| 2018/0151661 A1* | 5/2018 | Oh | H10D 86/40 |

(Continued)

FOREIGN PATENT DOCUMENTS

| | | |
|---|---|---|
| EP | 3089149 A1 | 11/2016 |
| EP | 3193322 A1 | 7/2017 |

(Continued)

*Primary Examiner* — Donald L Raleigh
(74) *Attorney, Agent, or Firm* — Seed Intellectual Property Law Group LLP

(57) ABSTRACT

A transparent display device is provided, which may repair a defective subpixel without loss of an aperture ratio and transmittance. The transparent display device comprises a substrate provided with a transmissive area and a non-transmissive area, a plurality of subpixels provided in the non-transmissive area, including a first electrode, a light emitting layer and a second electrode, a reference line extended from the non-transmissive area in a first direction, to which a reference voltage is applied, and a plurality of reference connection lines connected to the reference line to transfer the reference voltage to each of the plurality of subpixels. Each of the plurality of reference connection lines includes a first laser cutting area disposed between the plurality of subpixels.

21 Claims, 12 Drawing Sheets

(56) References Cited

U.S. PATENT DOCUMENTS

2021/0083221 A1  3/2021  Lee
2021/0143373 A1  5/2021  Kim et al.
2022/0123073 A1  4/2022  Li et al.

FOREIGN PATENT DOCUMENTS

| JP | 2006330469 A | 12/2006 |
| JP | 2017120408 A | 7/2017 |
| JP | 2018072823 A | 5/2018 |
| KR | 101012796 B1 | 2/2011 |
| KR | 20180030309 A | 3/2018 |
| WO | WO 2021227040 A1 | 11/2021 |

* cited by examiner

TRANSPARENT DISPLAY DEVICE

BACKGROUND

Technical Field

The present disclosure relates to a transparent display device.

Description of the Related Art

Recently, studies for a transparent display device in which a user may view objects or images positioned at an opposite side through the display device are actively ongoing. The transparent display device includes a display area on which an image is displayed, wherein the display area may include a transmissive area capable of transmitting external light and a non-transmissive area, and may have high light transmittance through the transmissive area.

BRIEF SUMMARY

Inventors of the present disclosure recognize that in a case that a plurality of subpixels provided with a circuit element and a light emitting element are disposed in a non-transmissive area, a defect may occur in the circuit element of the plurality of subpixels, whereby a dark spot or a bright spot may occur. As the transparent display device is provided with a transmissive area, a size of a light emission area is smaller than that of a general display device, whereby a defective subpixel in which a dark spot or a bright spot occurs may be easily seen to a user.

The present disclosure provides a transparent display device that may repair a defective subpixel without loss of an aperture ratio and transmittance.

In addition to the technical benefits of the present disclosure as mentioned above, additional technical benefits and features of the present disclosure will be clearly understood by those skilled in the art from the following description of the present disclosure.

In accordance with an aspect of the present disclosure, a transparent display device comprises a substrate provided with a transmissive area and a non-transmissive area, a plurality of subpixels provided in the non-transmissive area, including a first electrode, a light emitting layer and a second electrode, a reference line extended from the non-transmissive area in a first direction, to which a reference voltage is applied, and a plurality of reference connection lines connected to the reference line to transfer the reference voltage to each of the plurality of subpixels. Each of the plurality of reference connection lines includes a first laser cutting area disposed between the plurality of subpixels.

In accordance with another aspect of the present disclosure, a transparent display device comprises a substrate provided with a transmissive area and a non-transmissive area, a first subpixel and a second subpixel, which are disposed to be adjacent to each other in a first direction in the non-transmissive area, a first data line extended from the non-transmissive area in the first direction, to which a first data voltage is applied, a second data line extended from the non-transmissive area in the first direction, to which a second data voltage is applied, a first data connection line connected to the first data line to transfer the first data voltage to the first sub pixel, and a second data connection line connected to the second data line to transfer the second data voltage to the second subpixel. Each of the first data connection line and the second data connection line includes a laser cutting area disposed between the first subpixel and the second subpixel.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
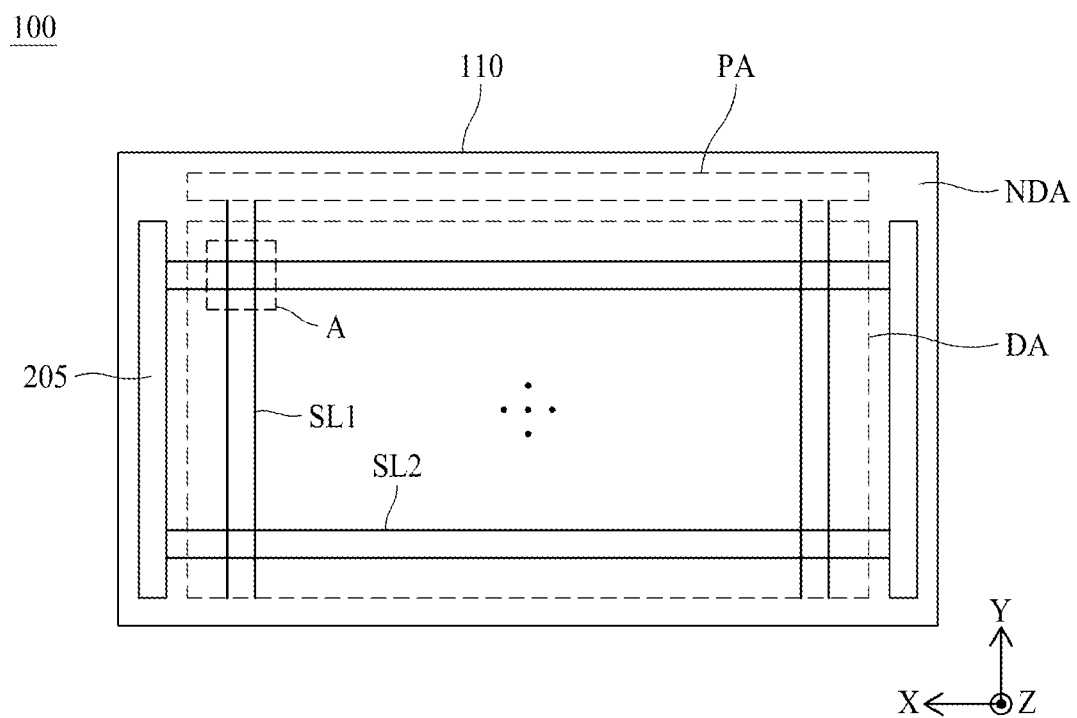
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a perspective view illustrating a display device according to one embodiment of the present disclosure.

Hereinafter, for example, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device, etc.

Referring to FIG. 1, a transparent display device according to one embodiment of the present disclosure includes a transparent display panel 110. The transparent display panel 110 may include a display area DA provided with pixels to display an image, and a non-display area NDA for not displaying an image.

The display area DA may be provided with a first signal lines SL1, a second signal lines SL2 and the pixels. The non-display area NDA may be provided with a pad area PA in which pads are disposed, and at least one scan driver 205.

The first signal lines SL1 may be extended in the display area DA in a first direction (e.g., Y-axis direction). The first signal lines SL1 may cross the second signal lines SL2 in the display area DA. The second signal lines SL2 may be extended in the display area DA in a second direction (e.g., X-axis direction). The pixel may be provided in an area where the first signal line SL1 and the second signal line SL2 cross each other, and emits predetermined or selected light to display an image.

The scan driver 205 are connected to the scan lines and supplies scan signals to the scan lines. The scan driver 205 may be disposed in the non-display area NDA on one side or both sides of the display area DA of the transparent display panel 110 by a gate driver in panel (GIP) method or a tape automated bonding (TAB) method.

Figure 2:
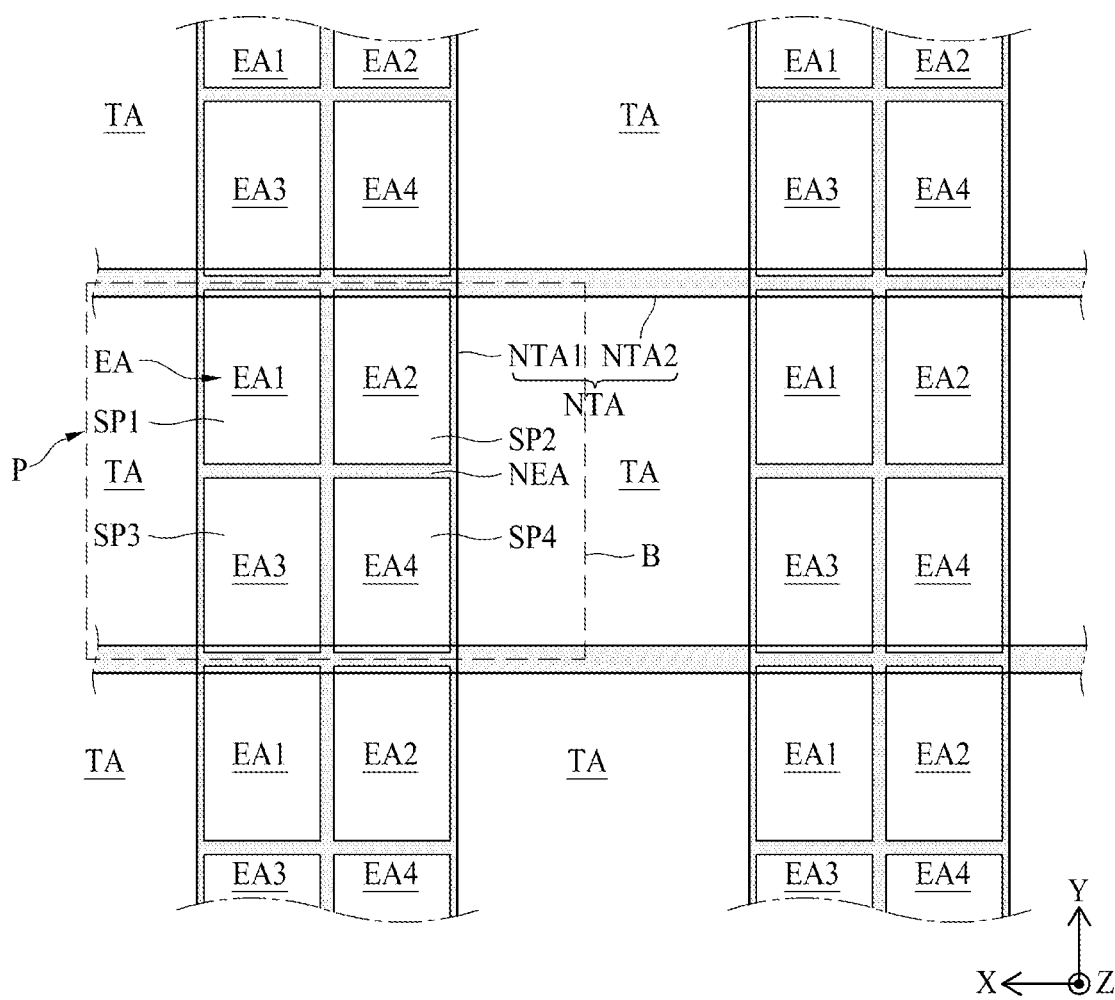
FIG. 2 is a schematic view illustrating an example of a pixel provided in an area A of FIG. 1.
Figure 3:
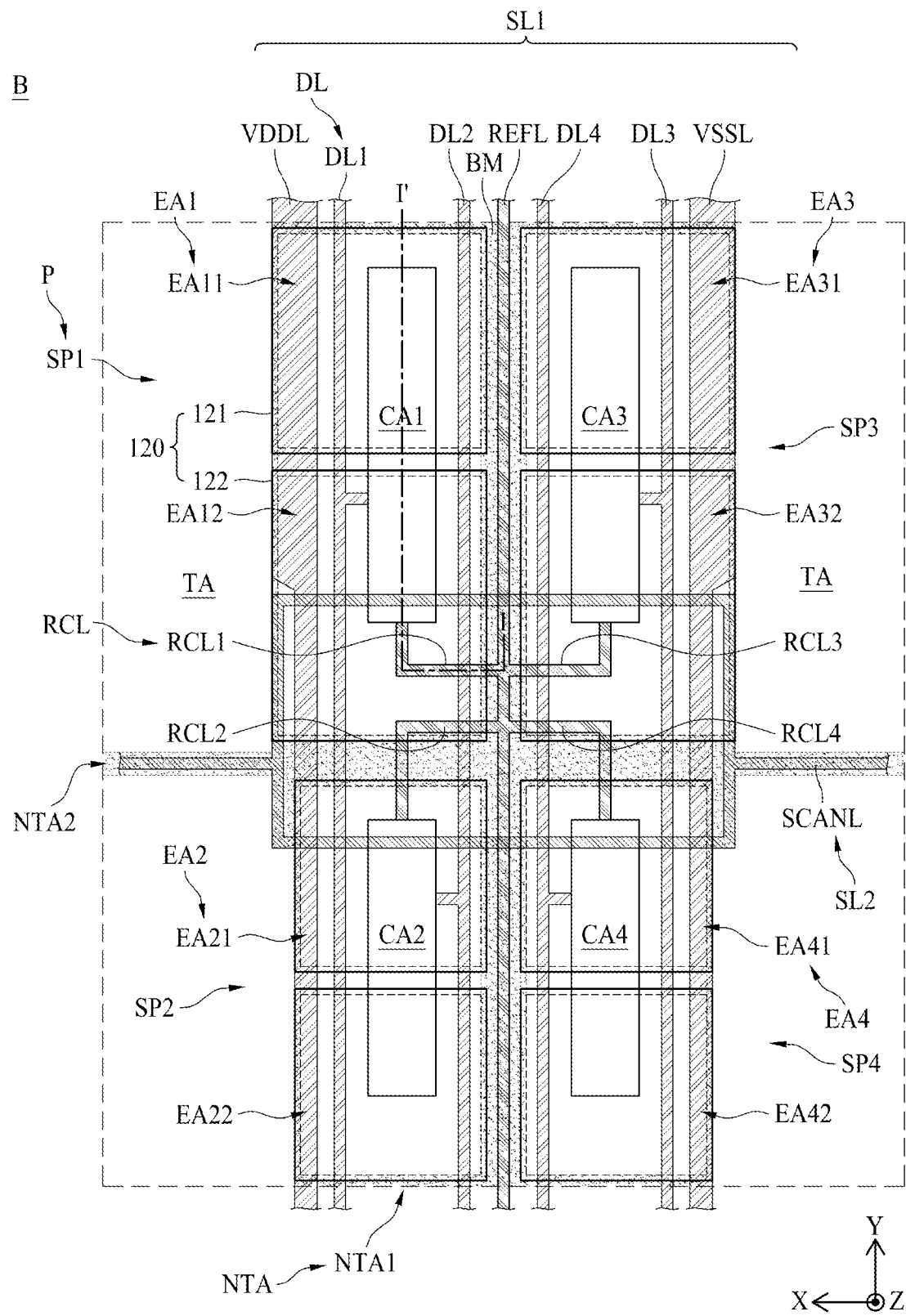
FIG. 3 is a view illustrating a first embodiment of a plurality of subpixels and a plurality of signal lines, which are provided in an area B of FIG. 2.
Figure 4:
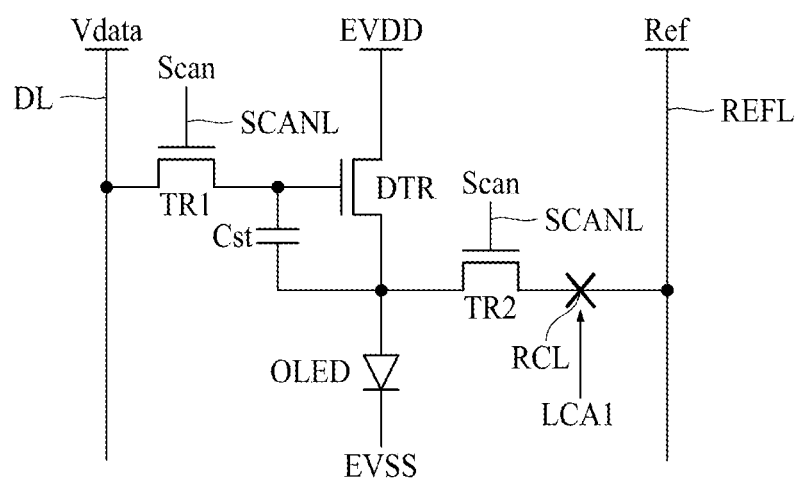
FIG. 4 is a circuit view illustrating an example of a subpixel of FIG. 3.
Figure 5:
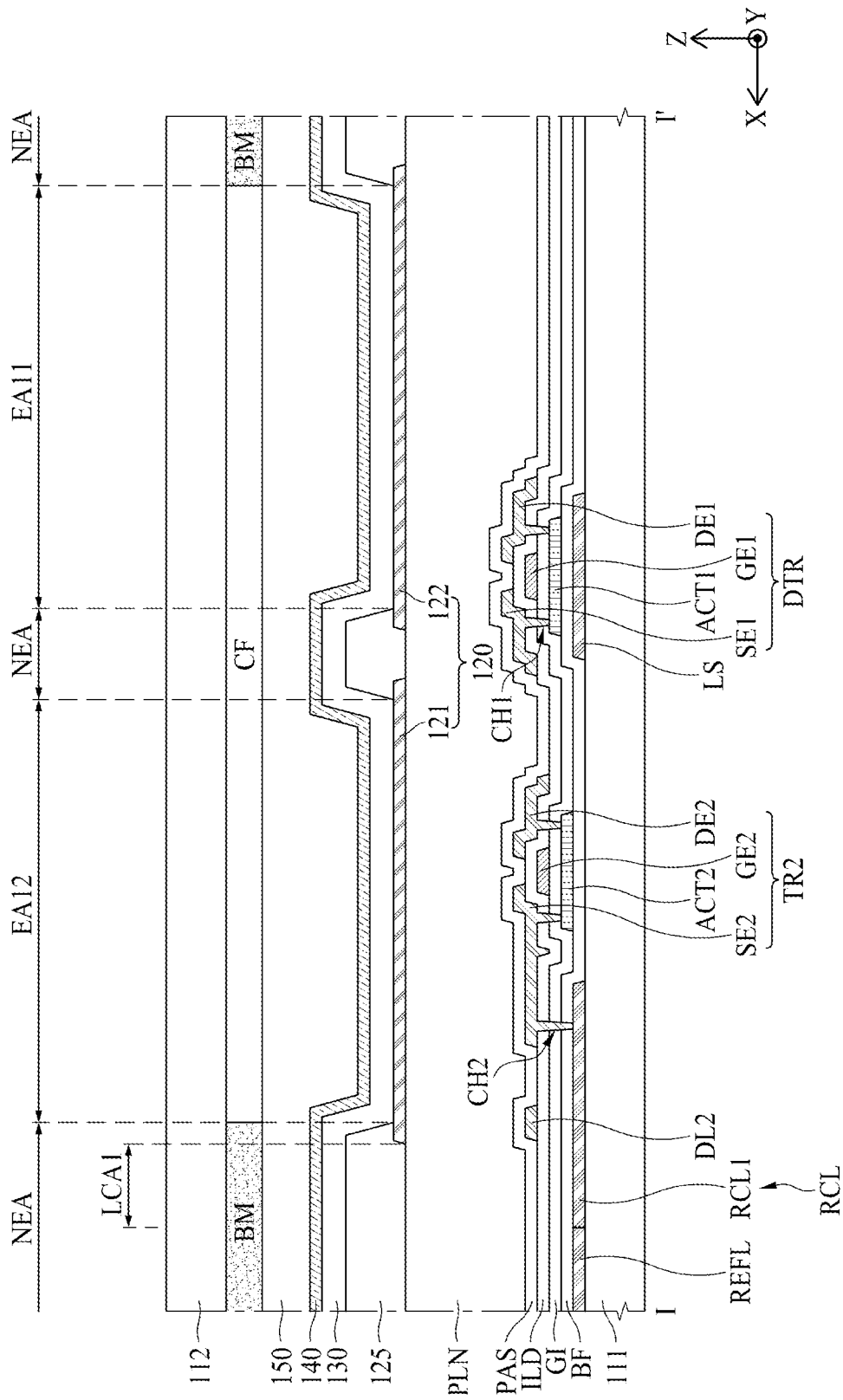
FIG. 5 is a cross-sectional view illustrating an example of line I-I' of FIG. 3.
Figure 6:
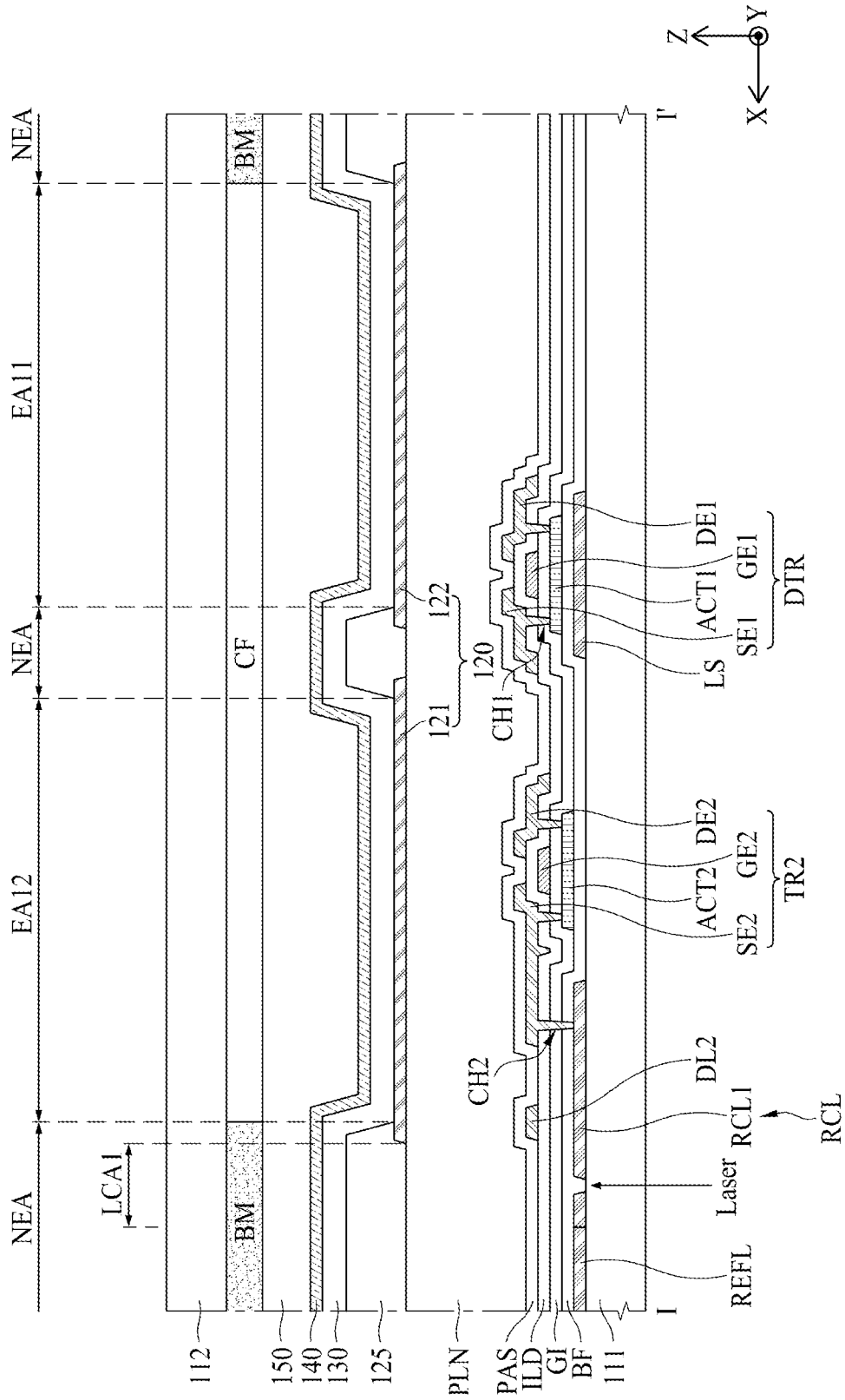
FIG. 6 is a view illustrating an example that a reference connection line is cut by laser when a defect occurs in a subpixel of FIG. 3.

FIG. 2 is a schematic view illustrating an example of a pixel provided in an area A of FIG. 1, FIG. 3 is a view illustrating a first embodiment of a plurality of subpixels and a plurality of signal lines, which are provided in an area B of FIG. 2, FIG. 4 is a circuit view illustrating an example of a subpixel of FIG. 3, and FIG. 5 is a cross-sectional view illustrating an example of line I-I' of FIG. 3. FIG. 6 is a view illustrating an example that a reference connection line is cut by laser when a defect occurs in a subpixel of FIG. 3.

The display area DA, as shown in FIG. 2, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, α is greater than β. A user may view an object or background arranged over a rear surface of the transparent display panel 110 due to the transmissive area TA.

The non-transmissive area NTA may include a first non-transmissive area NTA1, a second non-transmissive area NTA2 and a plurality of pixels P.

The first non-transmissive area NTA1 may be extended in a first direction (e.g., Y-axis direction) in a display area DA, and may be disposed to at least partially overlap light emission areas EA1, EA2, EA3 and EA4. A plurality of first non-transmissive areas NTA1 may be provided in the transparent display panel 110, and a transmissive area TA may be provided between two adjacent first non-transmissive areas NTA1. In the first non-transmissive area NTA1, first signals lines SL1 extended in the first direction (e.g., Y-axis direction) may be disposed to be spaced apart from each other.

For example, the first signal lines SL1 may include a reference line REFL and data lines DL1, DL2, DL3 and DL4. The first signal lines SL1 may further include at least one of a pixel power line VDDL and a common power line VSSL.

The pixel power line VDDL may supply a first power source to a driving transistor DTR of each of subpixels SP1, SP2, SP3 and SP4 provided in the display area DA. The first power source may be an anode power source.

The common power line VSSL may supply a second power source to a cathode electrode of the subpixels SP1, SP2, SP3 and SP4 provided in the display area DA. At this time, the second power source may be a cathode power source. The cathode power source may be a common power source commonly supplied to the subpixels SP1, SP2, SP3 and SP4.

The reference line REFL may supply an initialization voltage (or reference voltage) to the driving transistor DTR of each of the subpixels SP1, SP2, SP3 and SP4 provided in the display area DA. The reference line REFL may be disposed between the plurality of data lines DL1, DL2, DL3 and DL4. For example, the reference line REFL may be disposed at the center of the plurality of data lines DL1, DL2, DL3 and DL4, that is, between the second data line DL2 and the third data line DL3.

The reference line REFL may be diverged and connected to the plurality of subpixels SP1, SP2, SP3 and SP4. In detail, the reference line REFL may be connected to circuit elements of the plurality of subpixels SP1, SP2, SP3 and SP4 to supply an initialization voltage (or reference voltage) to each of the subpixels SP1, SP2, SP3 and SP4.

When the reference line REFL is disposed to be close to an edge of the first non-transmissive area NTA1, a deviation between connection lengths from the diverged point to the circuit element of each of the plurality of subpixels SP1, SP2, SP3 and SP4 is increased. In the transparent display panel 110 according to one embodiment of the present disclosure, the reference line REFL may be disposed in a middle area of the first non-transmissive area NTA1, whereby the deviation between the connection lengths to the circuit elements of the respective subpixels SP1, SP2, SP3 and SP4 may be reduced and/or minimized. Therefore, the reference line REFL may uniformly supply signals to the circuit element of each of the plurality of subpixels SP1, SP2, SP3 and SP4.

Each of the data lines DL1, DL2, DL3 and DL4 may supply a data voltage to the subpixels SP1, SP2, SP3 and SP4. For example, the first data line DL1 may supply a first data voltage to a first driving transistor of the first subpixel SP1, the second data line DL2 may supply a second data voltage to a second driving transistor of the second subpixel SP2, the third data line DL3 may supply a third data voltage to a third driving transistor of the third subpixel SP3 and the fourth data line DL4 may supply a fourth data voltage to a fourth driving transistor of the fourth subpixel SP4.

The transparent display panel 110 according to one embodiment of the present disclosure includes a pixel P between adjacent transmissive areas TA, and the pixel P may include light emission areas EA1, EA2, EA3 and EA4 in which a light emitting element is disposed to emit light. Since a size of the non-transmissive area NTA is small in the transparent display panel 110, the circuit element may be disposed to at least partially overlap the light emission areas EA1, EA2, EA3 and EA4. That is, the light emission areas EA1, EA2, EA3 and EA4 may include circuit areas CA1, CA2, CA3 and CA4 in which the circuit elements are disposed.

For example, the circuit areas may include a first circuit area CA1 in which a circuit element connected to the first subpixel SP1 is disposed, a second circuit area CA2 in which a circuit element connected to the second subpixel SP2 is disposed, a third circuit area CA3 in which a circuit element connected to the third subpixel SP3 is disposed, and a fourth circuit area CA4 in which a circuit element connected to the fourth subpixel SP4 is disposed.

The second non-transmissive area NTA2 may be extended in the display area DA in a second direction (e.g., X-axis direction), and may be disposed to at least partially overlap the light emission areas EA1, EA2, EA3 and EA4. A plurality of second non-transmissive areas NTA2 may be provided in the transparent display panel 110, and the transmissive area TA may be provided between two adjacent second non-transmissive areas NTA2.

The second signal line SL2 may be extended in the second direction (e.g., X-axis direction), and may include, for example, a scan line SCANL. The scan line SCANL may supply a scan signal to the subpixels SP1, SP2, SP3 and SP4 of the pixel P.

Pixels P may be provided to overlap at least one of the first signal line SL1 and the second signal line SL2, thereby emitting predetermined or selected light to display an image. A light emission area EA may correspond to an area, from which light is emitted, in the pixel P.

Each of the pixels P, as shown in FIG. 2, may include at least one of a first subpixel SP1, a second subpixel SP2, a third subpixel SP3 and a fourth subpixel SP4. The first subpixel SP1 may include a first light emission area EA1 emitting light of a first color. The second subpixel SP2 may include a second light emission area EA2 emitting light of a second color. The third subpixel SP3 may include a third light emission area EA3 emitting light of a third color. The fourth subpixel SP4 may include a fourth light emission area EA4 emitting light of a fourth color.

The first to fourth light emission area EA1, EA2, EA3 and EA4 may emit light of different colors. For example, the first light emission area EA1 may emit light of a white color. The second light emission area EA2 may emit light of a green color. The third light emission area EA3 may emit light of a red color. The fourth light emission area EA4 may emit light of a blue color. However, the light emission areas are not limited to this example. Each of the pixels P may further include a subpixel emitting light of a color other than red, green, blue and white. Also, the arrangement order of the subpixels SP1, SP2, SP3 and SP4 may be changed in various ways.

The light emission areas EA1, EA2, EA3 and EA4 respectively provided in the plurality of subpixels SP1, SP2, SP3 and SP4 may include a plurality of divided light emission areas. In detail, the first light emission area EA1 provided in the first subpixel SP1 is divided into four and thus may include a first divided light emission area EA11 and a second divided light emission area EA12. The second light emission area EA2 provided in the second subpixel SP2 is divided into four and thus may include a first divided light emission area EA21 and a second divided light emission area EA22. The third light emission area EA3 provided in the third subpixel SP3 is divided into four and thus may include a first divided light emission area EA31 and a second divided light emission area EA32. The fourth light emission area EA4 provided in the fourth subpixel SP4 is divided into four and thus may include a first divided light emission area EA41 and a second divided light emission area EA42. It should be understood that "divided" or "divided into" includes the meaning that one group or element contains different items or objects. The term "divided into" does not require the action of dividing. The term divided means it is possible, by the removal of one or more bridges to electrically isolate the electrode from all other electrodes, namely, fully electrically and physically isolate (e.g., divide) one electrode from other electrodes. Thus, the term "divided electrode" includes within it the meaning that this electrode can be electrically isolated from all other electrodes, namely, it has been divided by removal of the bridge electrodes connecting it to other electrodes.

As shown in FIG. 4, each of the first subpixel SP1, the second subpixel SP2, the third subpixel SP3 and the fourth subpixel SP4 may include a first switching transistor TR1, a second switching transistor TR2, a driving transistor DTR, a circuit element including a capacitor Cst, and a light emitting element OLED.

The first switching transistor TR1 serves to supply a data voltage Vdata supplied from a data line DL to the driving transistor DTR. In detail, the first switching transistor TR1 may charge the data voltage Vdata supplied from the data line DL in the capacitor Cst. To this end, a gate electrode of the first switching transistor TR1 may be connected to a scan line SCANL, and a first electrode thereof may be connected to the data line DL. In addition, a second electrode of the first switching transistor TR1 may be connected to one end of the capacitor Cst, that is, a gate electrode of the driving transistor DTR.

The first switching transistor TR1 may be turned on in response to a scan signal Scan applied through the scan line SCANL. When the first switching transistor TR1 is turned on, the data voltage Vdata applied through the data line DL may be transferred to one end of the capacitor Cst.

The second switching transistor TR2 serves to supply a reference voltage Ref supplied from a reference line REFL to the driving transistor DTR. In more detail, a gate electrode of the second switching transistor TR2 may be connected to the scan line SCANL, and a first electrode thereof may be connected to the reference line REFL. In addition, a second electrode of the second switching transistor TR2 may be connected to a source electrode of the driving transistor DTR and the other end of the capacitor Cst.

The second switching transistor TR2 may be turned on in response to the scan signal Scan applied through the scan line SCANL. When the second switching transistor TR2 is turned on, the reference voltage Ref applied through the reference line REFL may be transferred to the other end of the capacitor Cst. Also, the reference voltage Ref may be applied to the source electrode of the driving transistor DTR.

The capacitor Cst serves to maintain the data voltage Vdata supplied to the driving transistor DTR for one frame. In detail, a first electrode of the capacitor Cst may be connected to the gate electrode of the driving transistor DTR, and the second electrode thereof may be connected to the source electrode of the driving transistor DTR. The capacitor Cst may store a voltage corresponding to the data voltage Vdata transferred through the first switching transistor TR1, and may turn on the driving transistor DTR by using the stored voltage.

The driving transistor DTR generates a data current from a first power source EVDD supplied from a pixel power line VDDL and supplies the data current to an anode electrode of each of the subpixels SP1, SP2, SP3 and SP4. In detail, the gate electrode of the driving transistor DTR may be connected to one end of the capacitor Cst, and a drain electrode thereof may be connected to the pixel power line VDDL. Further, the source electrode of the driving transistor DTR may be connected to an anode electrode of the light emitting element OLED.

The driving transistor DTR may be turned on in accordance with the data voltage charged in the capacitor Cst. When the driving transistor DTR is turned on, the driving transistor DTR may transfer the first power source EVDD applied through the pixel power line VDDL to the anode electrode of the light emitting element OLED.

The anode electrode of the light emitting element OLED may be connected to the source electrode of the driving transistor DTR, and a cathode electrode thereof may be connected to a common power line VSSL. The light emitting element OLED may emit light in response to a driving current generated by the driving transistor DTR.

Hereinafter, the configuration of the circuit element and the light emitting element OLED display will be described in more detail with reference to FIG. 5.

Referring to FIG. 5, a light shielding layer LS may be provided over a first substrate 111. The light shielding layer LS may serve to shield external light incident on an active layer ACT1 in an area where the driving transistor DTR is provided. The light shielding layer LS may include a single layer or multi-layer made of any one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least a portion of a pixel power line VDDL, a common power line VSSL, a reference line REFL, a reference connection line RCL, data lines DL and a scan line SCANL may be provided on the same layer as the light shielding layer LS. For example, the reference line REFL and the reference connection line RCL may include the same material as that of the light shielding layer LS on the same layer as the light shielding layer LS, but are not limited thereto.

A buffer layer BF may be provided over the light shielding layer LS. The buffer layer BF is to protect the transistors from water permeated through the first substrate 111 vulnerable to water permeation, and may include an inorganic layer, for example, a silicon oxide layer (SiOx), a silicon nitride layer (SiNx) or a multi-layer of the silicon oxide layer and the silicon nitride layer.

An active layer ACT1, ACT2 of the transistors DTR, TR2 may be provided over the buffer layer BF. The active layer ACT1, ACT2 may include a silicon-based semiconductor material or an oxide-based semiconductor material.

A gate insulating layer GI may be provided over the active layer ACT1, ACT2 of the transistors DTR, TR2. The gate insulating layer GI may include an inorganic layer, for example, a silicon oxide layer (SiOx), a silicon nitride layer (SiNx) or a multi-layer of the silicon oxide layer and the silicon nitride layer.

A gate electrode GE1, GE2 of the transistors DTR, TR2 may be provided over the gate insulating layer GI. The gate electrode GE1, GE2 may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least a portion of the pixel power line VDDL, the common power line VSSL, the reference line REFL, the reference connection line RCL, data lines DL and the scan line SCANL may be provided on the same layer as the gate electrode GE1, GE2 of the transistors DTR, TR2. For example, the scan line SCANL may include the same material as that of the gate electrode GE1, GE2 of the transistors DTR, TR2 on the same layer as the gate electrode GE1, GE2 of the transistors DTR, TR2, but are not limited thereto.

An interlayer dielectric layer ILD may be provided over the gate electrode GE1, GE2 of the transistors DTR, TR2. The interlayer dielectric layer ILD may include an inorganic layer, for example, a silicon oxide layer (SiOx), a silicon nitride layer (SiNx) or a multi-layer of the silicon oxide layer and the silicon nitride layer.

A source electrode SE1, SE2 and a drain electrode DE1, DE2 of the transistors DTR, TR2 may be provided over the interlayer dielectric layer ILD. The source electrode SE1, SE2 and a drain electrode DE1, DE2 may be connected to the active layer ACT1, ACT2 through a first contact hole CH1 passing through the gate insulating layer GI and the interlayer dielectric layer ILD. The source electrode SE1, SE2 and a drain electrode DE1, DE2 of the transistors DTR, TR2 may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least one of the pixel power line VDDL, the common power line VSSL, the reference line REFL, the reference connection line RCL, data lines DL and the scan line SCANL may be provided in the same layer as the source electrode SE1, SE2 and a drain electrode DE1, DE2 of the transistors DTR, TR2. For example, the pixel power line VDDL, the common power line VSSL and the data lines DL may include the same material as that of the source electrode SE1, SE2 and a drain electrode DE1, DE2 of the transistors DTR, TR2 in the same layer as the source electrode SE1, SE2 and a drain electrode DE1, DE2 of the transistors DTR, TR2, but are not limited thereto.

The passivation layer PAS for insulating the driving transistor DTR may be provided over source electrode SE1, SE2 and a drain electrode DE1, DE2 of the transistors DTR, TR2. The planarization layer PLN may be provided over the passivation layer PAS to planarize a step difference due to the transistors DTR, TR2 and the plurality of signal lines. The planarization layer PLN may include an organic layer such as an acrylic resin, an epoxy resin, a phenolic resin, a polyamide resin and a polyimide resin.

A light emitting element OLED, which includes a first electrode 120, an organic light emitting layer 130 and a second electrode 140, and a bank 125 may be provided over the planarization layer PLN.

The first electrode 120 may be provided over the planarization layer PLN for each of the subpixels SP1, SP2, SP3 and SP4. The first electrode 120 is not provided in the transmissive area TA. The first electrode 120 may be connected to the driving transistor DTR. In detail, the first electrode 120 may be connected to one of the source electrode SE1 and the drain electrode DE1 of the driving transistor DTR through a contact hole (not shown) that passes through the planarization layer PLN and the passivation layer PAS.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode of the light emitting element OLED.

The first electrode 120 provided in each of the plurality of subpixels SP1, SP2, SP3 and SP4 may include a plurality of divided electrodes. For example, the first electrode 120 provided in each of the plurality of subpixels SP1, SP2, SP3 and SP4 may include, but is not limited to, a first divided electrode 121 and a second divided electrode 122. The first divided electrodes 121 may be disposed in the first divided light emission areas EA11, EA21, EA31 and EA41, and the second divided electrodes 122 may be disposed in the second divided light emission areas EA12, EA22, EA32 and EA42. The first and second divided electrodes 121 and 122 may be disposed to be spaced apart from each other in the same layer.

The bank 125 may be provided over the planarization layer PLN. The bank 125 may be provided to at least partially cover an edge of the first electrode 120 and expose a portion of the first electrode 120. Therefore, the bank 125 may prevent or reduce a problem in which light emitting efficiency is deteriorated due to concentration of a current on an end of the first electrode 120.

The bank 125 may surround light emission areas EA1, EA2, EA3 and EA4 of the subpixels SP1, SP2, SP3 and SP4. The light emission areas EA1, EA2, EA3 and EA4 of each of the subpixels SP1, SP2, SP3 and SP4 represent an area in which the first electrode 120, the organic light emitting layer 130 and the second electrode 140 are sequentially stacked and holes from the first electrode 120 and electrons from the second electrode 140 are combined with each other in the organic light emitting layer 130 to emit light. In this case, the area in which the bank 125 is provided may become the non-light emission area NEA because light is not emitted therefrom, and the area in which the bank 125 is not provided and the first electrode is exposed may become the light emission area EA1, EA2, EA3 and EA4.

The bank 125 may include an organic layer such as an acrylic resin, an epoxy resin, a phenolic resin, a polyamide resin, and a polyimide resin.

The organic light emitting layer 130 may be disposed over the first electrode 120. The organic light emitting layer 130 may include a hole transporting layer, a light emitting layer and an electron transporting layer. In this case, when a voltage is applied to the first electrode 120 and the second electrode 140, holes and electrons move to the light emitting layer through the hole transporting layer and the electron transporting layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, the light emitting layer of the organic light emitting layer 130 may be provided for each of the subpixels SP1, SP2, SP3 and SP4. For example, a white light emitting layer for emitting white light may be provided in the first subpixel SP1, a green light emitting layer for emitting green light may be provided in the second subpixel SP2, a red light emitting layer for emitting red light may be provided in the third subpixel SP3, and a blue light emitting layer for emitting blue light may be provided in the fourth subpixel SP4. In this case, the light emitting layer of the organic light emitting layer 130 is not provided in the transmissive area TA.

A second electrode 140 may be disposed over the organic light emitting layer 130 and the bank 125. The second electrode 140 may be provided in the non-transmissive area NTA including the light emission area EA1, EA2, EA3, EA4 and the transmissive area TA, but is not limited thereto. The second electrode 140 may be provided only in the non-transmissive area NTA including the light emission area EA1, EA2, EA3, EA4 and may not be provided in the transmissive area TA to improve transmittance.

The second electrode 140 may be a common layer commonly provided in the subpixels SP1, SP2, SP3 and SP4 to apply the same voltage. The second electrode 140 may include a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 includes a semi-transmissive conductive material, light emitting efficiency may be increased by a micro cavity.

An encapsulation layer 150 may be provided over the light emitting elements. The encapsulation layer 150 may be provided over the second electrode 140 to at least partially cover the second electrode 140. The encapsulation layer 150 serves to prevent or reduce oxygen or water from being permeated into the organic light emitting layer 130 and the second electrode 140. To this end, the encapsulation layer 150 may include at least one inorganic layer and at least one organic layer.

Meanwhile, although not shown in figures, a capping layer may additionally be provided between the second electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer (not shown). At this time, the adhesive layer (not shown) may be an optically clear resin (OCR) layer or an optically clear adhesive (OCA) film.

The color filter CF may be provided to be patterned for each of the subpixels SP1, SP2, SP3 and SP4. In detail, the color filter CF may include a first color filter, a second color filter, and a third color filter. The first color filter may be disposed to correspond to the light emission area EA1 of the first subpixel SP1, and may be a white color filter that transmits white light. The white color filter may include a transparent organic material that transmits white light. The second color filter may be disposed to correspond to the light emission area EA2 of the second subpixel SP2, and may be a green color filter that transmits green light. The third color filter may be disposed to correspond to the light emission area EA3 of the third subpixel SP3, and may be a red color filter that transmits red light. In an embodiment, the color filter CF may further include a fourth color filter. The fourth color filter may be disposed to correspond to the light emission area EA4 of the fourth subpixel SP4 and may be a blue color filter that transmits blue light.

A black matrix BM may be provided between color filters CF and between the color filter CF and the transmissive area TA. The black matrix BM may be provided between the subpixels SP1, SP2, SP3 and SP4 to prevent or reduce a color mixture from occurring between adjacent subpixels SP1, SP2, SP3 and SP4, and may prevent or reduce light incident from the outside from being reflected toward a plurality of signal lines provided between the subpixels SP1, SP2, SP3 and SP4, e.g., scan lines SCANL, data lines DL, pixel power lines VDDL, common power lines VSSL, reference lines REFL and reference connection line RCL.

In addition, the black matrix BM may be provided between the transmissive area TA and the plurality of subpixels SP1, SP2, SP3 and SP4 to prevent or reduce light emitted from each of the plurality of subpixels SP1, SP2, SP3 and SP4 from moving to the transmissive area TA. The black matrix BM may include a material that absorbs light, for example, a black dye that absorbs light of all visible wavelength ranges.

In the transparent display panel 110 according to one embodiment of the present disclosure, a defect may occur in a portion of the circuit elements respectively provided in a plurality of subpixels SP1, SP2, SP3 and SP4. For example, in the transparent display panel 110, a defect may occur in the driving transistor DTR. In the transparent display panel 110, the light emitting element connected to the driving transistor DTR in which a defect occurs may not emit light or emit light with high luminance, whereby the defective subpixel may be visible to a user.

In the transparent display panel 110 according to one embodiment of the present disclosure, when a defect occurs in a portion of the circuit elements, the reference line REFL may be electrically separated from the circuit element in which a defect occurs, whereby the defective subpixel may be repaired.

In detail, the transparent display panel 110 according to one embodiment of the present disclosure may include a plurality of reference connection lines RCL connected to the reference line REFL to transfer the reference voltage Ref to each of the plurality of subpixels SP1, SP2, SP3 and SP4. The plurality of reference connection lines RCL may include a first reference connection line RCL1 for transferring the reference voltage Ref to the first subpixel SP1, a second reference connection line RCL2 for transferring the reference voltage Ref to the second subpixel SP2, a third reference connection line RCL3 for transferring the reference voltage Ref to the third subpixel SP3, and a fourth reference connection line RCL4 for transferring the reference voltage Ref to the fourth subpixel SP4.

One end of the first reference connection line RCL1 may be connected to the reference line REFL. The first reference connection line RCL1 may be diverged from one side of the reference line REFL and extended to a first circuit area CA1 of the first subpixel SP1. The other end of the first reference connection line RCL1 may at least partially overlap the second switching transistor TR2 of the first subpixel SP1, and thus may be connected to a source electrode SE2 of the second switching transistor TR2 through a second contact hole CH2. Therefore, the first reference connection line RCL1 may transfer the reference voltage Ref applied from the reference line REFL to the second switching transistor TR2 of the first subpixel SP1.

One end of the second reference connection line RCL2 may be connected to the reference line REFL. The second reference connection line RCL2 may be diverged from one side of the reference line REFL and extended to a second circuit area CA2 of the second subpixel SP2. The other end of the second reference connection line RCL2 may at least partially overlap the second switching transistor TR2 of the second subpixel SP2, and thus may be connected to the source electrode SE2 of the second switching transistor TR2 through the second contact hole CH2. Therefore, the second reference connection line RCL2 may transfer the reference voltage Ref applied from the reference line REFL to the second switching transistor TR2 of the second subpixel SP2.

One end of the third reference connection line RCL3 may be connected to the reference line REFL. The third reference connection line RCL3 may be diverged from the other side of the reference line REFL and extended to a third circuit area CA3 of the third subpixel SP3. The other end of the third reference connection line RCL3 may at least partially overlap the second switching transistor TR2 of the third subpixel SP3, and thus may be connected to the source electrode SE2 of the second switching transistor TR2 through the second contact hole CH2. Therefore, the third reference connection line RCL3 may transfer the reference voltage Ref applied from the reference line REFL to the second switching transistor TR2 of the third subpixel SP3.

One end of the fourth reference connection line RCL4 may be connected to the reference line REFL. The fourth reference connection line RCL4 may be diverged from the other side of the reference line REFL and extended to a fourth circuit area CA4 of the fourth subpixel SP4. The other end of the fourth reference connection line RCL4 may at least partially overlap the second switching transistor TR2 of the fourth subpixel SP4, and thus may be connected to the source electrode SE2 of the second switching transistor TR2 through the second contact hole CH2. Therefore, the fourth reference connection line RCL4 may transfer the reference voltage Ref applied from the reference line REFL to the second switching transistor TR2 of the fourth subpixel SP4.

Each of the first, second, third and fourth reference connection lines RCL1, RCL2, RCL3 and RCL4 may include a first laser cutting area LCA1 provided between the plurality of subpixels SP1, SP2, SP3 and SP4. In one embodiment, the first laser cutting area LCA1 may be disposed between the subpixels SP1, SP2, SP3, SP4 disposed to be adjacent to each other in the second direction (e.g., X-axis direction). The first laser cutting area LCA1 of each of the first, second, third and fourth reference connection lines RCL1, RCL2, RCL3 and RCL4 may be disposed between the first and third subpixels SP1 and SP3 disposed to be adjacent to each other in the second direction (e.g., X-axis direction) or between the second and fourth subpixels SP2 and SP4 disposed to be adjacent to each other in the second direction (e.g., X-axis direction). For example, the first laser cutting area LCA1 of each of the first and third reference connection lines RCL1 and RCL3 may be disposed between the first and third subpixels SP1 and SP3 disposed to be adjacent to each other in the second direction (e.g., X-axis direction).

In the transparent display panel 110 according to one embodiment of the present disclosure, when a defect occurs in a portion of the circuit elements, the reference connection line RCL disposed in the first laser cutting area LCA1 may be cut by laser as shown in FIG. 6, whereby the reference line REFL and the circuit element in which a defect occurs may be electrically separated from each other. When the reference connection line RCL provided in the first laser cutting area LCA1 is cut by laser, as shown in FIG. 4, the second switching transistor TR2 is electrically separated from the reference line REFL, so that the reference voltage Ref is not applied from the reference line REFL. Therefore, the driving transistor DTR does not operate since the reference voltage Ref is not supplied from the second switching transistor TR2, and as a result, the light emitting element OLED cannot emit light. That is, at least one subpixel SP1, SP2, SP3 or SP4 that includes a defective circuit element may become a dark spot through repair.

As described above, in the transparent display panel 110 according to one embodiment of the present disclosure, the first laser cutting area LCA1 may be disposed between the plurality of subpixels SP1, SP2, SP3 and SP4. That is, in the transparent display panel 110 according to one embodiment of the present disclosure, the first laser cutting area LCA1 may not overlap a first electrode 120 provided in each of the plurality of subpixels SP1, SP2, SP3 and SP4. In the transparent display panel 110 according to one embodiment of the present disclosure, the first laser cutting area LCA1 does not overlap the first electrode 120 so that the reference connection line RCL may be cut by laser without damage of the first electrode 120.

Also, in the transparent display panel 110 according to one embodiment of the present disclosure, at least part of the first laser cutting area LCA1 may overlap the black matrix BM. Therefore, in the transparent display panel 110 according to one embodiment of the present disclosure, the reference connection line RCL may be cut by laser without loss of an aperture ratio.

Figure 7:
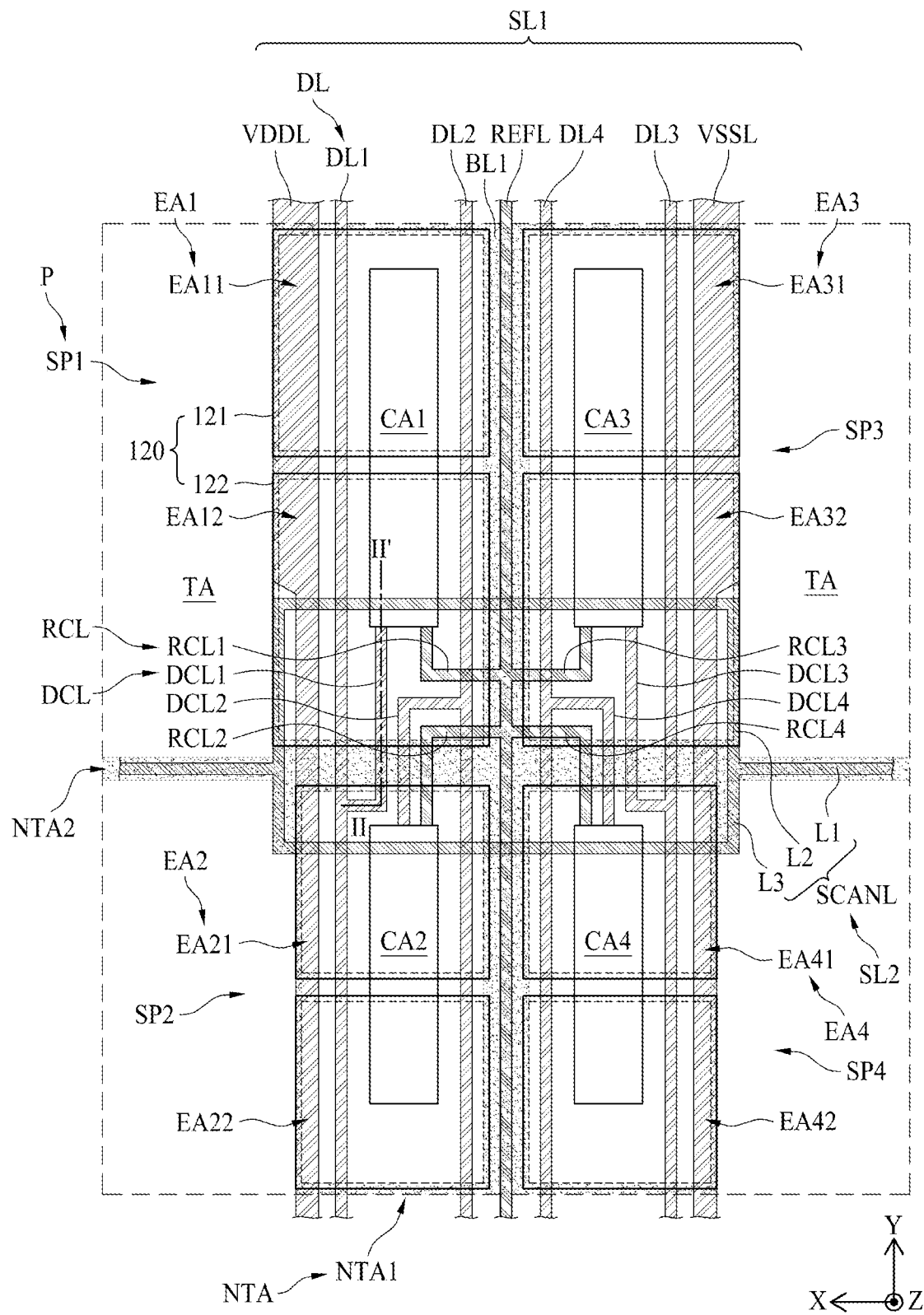
FIG. 7 is a view illustrating a second embodiment of a plurality of subpixels and a plurality of signal lines, which are provided in an area B of FIG. 2.
Figure 8:
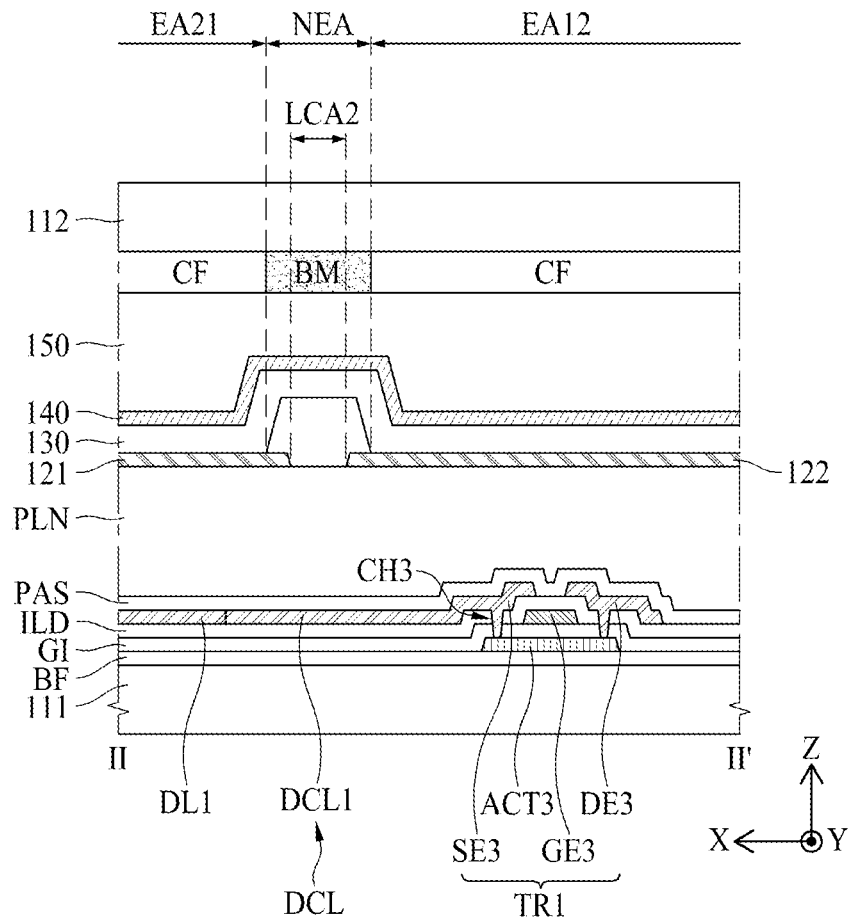
FIG. 8 is a cross-sectional view illustrating an example of line II-IF of FIG. 7.
Figure 9:
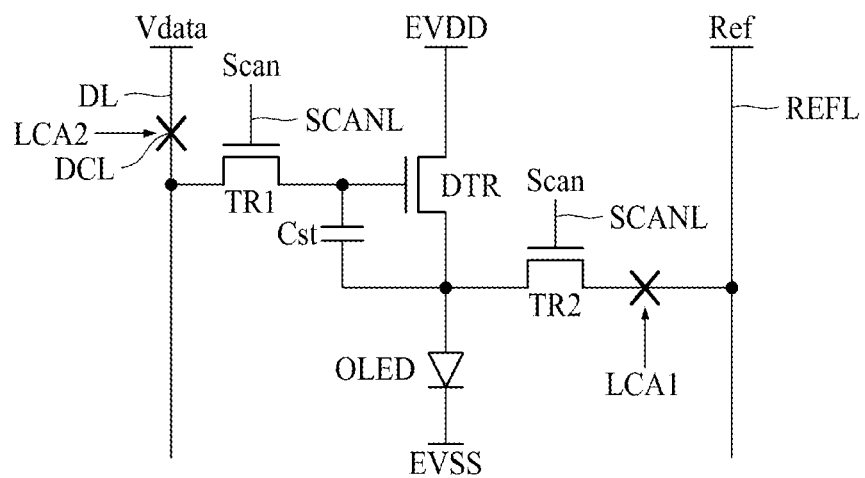
FIG. 9 is a circuit view illustrating a laser cutting area when a defect occurs in a subpixel of FIG. 7.
Figure 10:
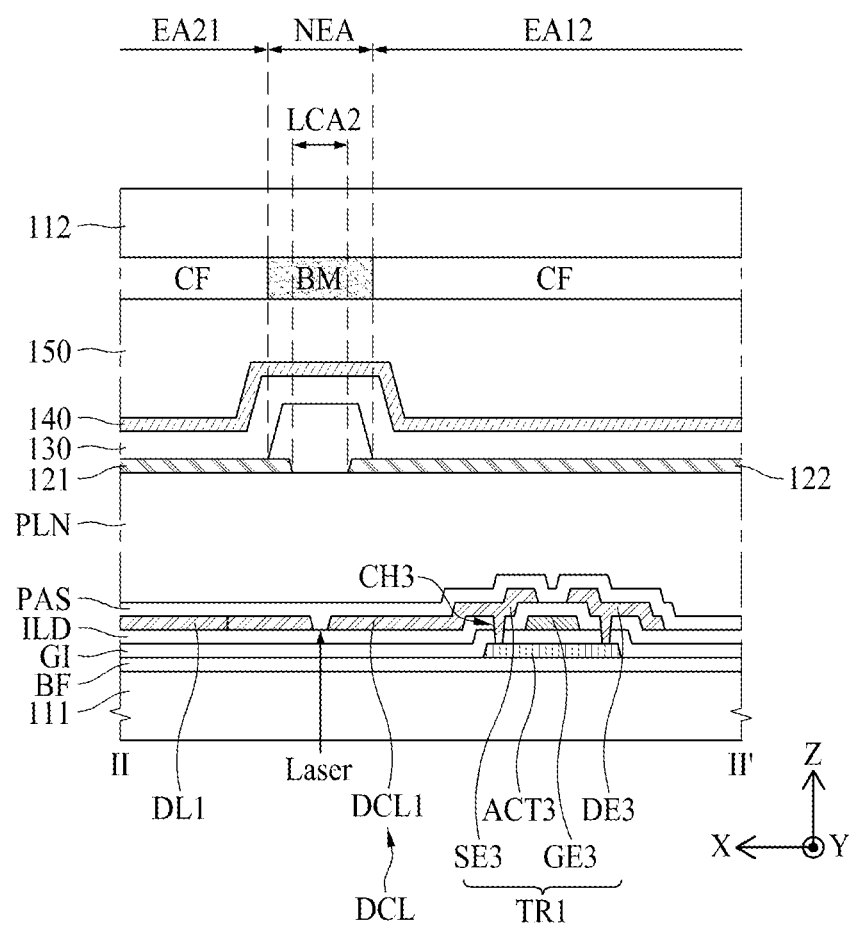
FIG. 10 is a view illustrating an example that a data connection line is cut by laser when a defect occurs in a subpixel of FIG. 7.

FIG. 7 is a view illustrating a second embodiment of a plurality of subpixels and a plurality of signal lines, which are provided in an area B of FIG. 2, and FIG. 8 is a cross-sectional view illustrating an example of line II-II' of FIG. 7. FIG. 9 is a circuit view illustrating a laser cutting area when a defect occurs in a subpixel of FIG. 7, and FIG. 10 is a view illustrating an example that a data connection line is cut by laser when a defect occurs in a subpixel of FIG. 7.

The transparent display panel 110 shown in FIGS. 7 to 10 is different from the transparent display panel 110 shown in FIGS. 3 to 6 in that the data connection line DCL is provided between the plurality of subpixels SP1, SP2, SP3 and SP4. Hereinafter, the description will be based on differences from the transparent display panel 110 shown in FIGS. 3 to 6, and a detailed description except the data connection line DCL will be omitted.

Referring to FIGS. 7 to 10, in the transparent display panel 110 according to another embodiment of the present disclosure, when a defect occurs in a portion of the circuit elements, the reference line REFL may be electrically separated from the circuit element in which a defect occurs, whereby the defective subpixel may be repaired. Since the case that the reference line REFL is electrically separated from the circuit element in which a defect occurs is substantially the same as that described with reference to FIGS. 3 to 6, its detailed description will be omitted.

Also, in the transparent display panel 110 according to another embodiment of the present disclosure, when a defect occurs in a portion of the circuit elements, the data line DL may be electrically separated from the circuit element in which a defect occurs, whereby the defective subpixel may be repaired.

In detail, the transparent display panel 110 according to one embodiment of the present disclosure may include a plurality of data connection lines DCL connected to the data line DL to transfer the data voltage Vdata to each of the plurality of subpixels SP1, SP2, SP3 and SP4. The plurality of data connection lines DCL may include a first data connection line DCL1 for transferring a first data voltage Vdata to the first subpixel SP1, a second data connection line DCL2 for transferring a second data voltage Vdata to the second subpixel SP2, a third data connection line DCL3 for transferring a third data voltage Vdata to the third subpixel SP3, and a fourth data connection line DCL4 for transferring a fourth data voltage Vdata to the fourth subpixel SP4.

One end of the first data connection line DCL1 may at least partially overlap the second subpixel SP2 disposed to be adjacent to the first subpixel SP1 in the first direction (e.g., Y-axis direction). The first data connection line DCL1 may be connected to one side of the first data line DL1 disposed in an area overlapped with the second subpixel SP2 and thus extended to the first circuit area CA1 of the first subpixel SP1. The other end of the first data connection line DCL1 may at least partially overlap the first switching transistor TR1 of the first subpixel SP1, and thus may be connected to a source electrode SE3 of the first switching transistor TR1 connected to an active layer ACT3 through a third contact hole CH3. Therefore, the first data connection line DCL1 may transfer the first data voltage Vdata applied from the first data line DL1 to the first switching transistor TR1 of the first subpixel SP1.

One end of the second data connection line DCL2 may at least partially overlap the first subpixel SP1 disposed to be adjacent to the second subpixel SP2 in the first direction (e.g., Y-axis direction). The second data connection line DCL2 may be connected to one side of the second data line DL2 disposed in an area overlapped with the first subpixel SP1 and thus extended to the second circuit area CA2 of the second subpixel SP2. The other end of the second data connection line DCL2 may at least partially overlap the first switching transistor TR1 of the second subpixel SP2, and thus may be connected to the source electrode SE3 of the first switching transistor TR1 connected to an active layer ACT3 through the third contact hole CH3. Therefore, the second data connection line DCL2 may transfer the second data voltage Vdata applied from the second data line DL2 to the first switching transistor TR1 of the second subpixel SP2.

One end of the third data connection line DCL3 may at least partially overlap the fourth subpixel SP4 disposed to be adjacent to the third subpixel SP3 in the first direction (e.g., Y-axis direction). The third data connection line DCL3 may be connected to one side of the third data line DL3 disposed in an area overlapped with the fourth subpixel SP4 and thus extended to the third circuit area CA3 of the third subpixel SP3. The other end of the third data connection line DCL3 may at least partially overlap the first switching transistor TR1 of the third subpixel SP3, and thus may be connected to the source electrode SE3 of the first switching transistor TR1 connected to an active layer ACT3 through the third contact hole CH3. Therefore, the third data connection line DCL3 may transfer the third data voltage Vdata applied from the third data line DL3 to the first switching transistor TR1 of the third subpixel SP3.

One end of the fourth data connection line DCL4 may at least partially overlap the third subpixel SP3 disposed to be adjacent to the fourth subpixel SP3 in the first direction (e.g., Y-axis direction). The fourth data connection line DCL4 may be connected to one side of the fourth data line DL4 disposed in an area overlapped with the third subpixel SP3 and thus extended to the fourth circuit area CA4 of the fourth subpixel SP4. The other end of the fourth data connection line DCL4 may at least partially overlap the first switching transistor TR1 of the fourth subpixel SP4, and thus may be connected to the source electrode SE3 of the first switching transistor TR1 connected to an active layer ACT3 through the third contact hole CH3. Therefore, the fourth data connection line DCL4 may transfer the fourth data voltage Vdata applied from the fourth data line DL4 to the first switching transistor TR1 of the fourth subpixel SP4.

Each of the first, second, third and fourth data connection lines DCL1, DCL2, DCL3 and DCL4 may include a second laser cutting area LCA2 provided between the plurality of subpixels SP1, SP2, SP3 and SP4. In one embodiment, the second laser cutting area LCA2 may be disposed between the subpixels SP1, SP2, SP3 and SP4 disposed to be adjacent to each other in the first direction (e.g., Y-axis direction). The second laser cutting area LCA2 of each of the first, second, third and fourth data connection lines DCL1, DCL2, DCL3 and DCL4 may be disposed between the first and second subpixels SP1 and SP2 disposed to be adjacent to each other in the first direction (e.g., Y-axis direction) or between the third and fourth subpixels SP3 and SP4 disposed to be adjacent to each other in the first direction (e.g., Y-axis direction). For example, the second laser cutting area LCA2 of each of the first and second data connection lines DCL1 and DCL2 may be disposed between the first and second subpixels SP1 and SP2 disposed to be adjacent to each other in the first direction (e.g., Y-axis direction). For another example, the second laser cutting area LCA2 of each of the third and fourth data connection lines DCL3 and DCL4 may be disposed between the third and fourth subpixels SP3 and SP4 disposed to be adjacent to each other in the first direction (e.g., Y-axis direction).

Each of the first, second, third and fourth data connection lines DCL1, DCL2, DCL3 and DCL4 may be extended from the second laser cutting area LCA2 in the first direction (e.g., Y-axis direction). The first, second, third and fourth data connection lines DCL1, DCL2, DCL3 and DCL4 may be disposed in parallel in the second laser cutting area LCA2.

In the transparent display panel 110 according to one embodiment of the present disclosure, when a defect occurs in a portion of the circuit elements, the data connection line DCL of the second laser cutting area LCA2 may be cut by laser as shown in FIG. 8, whereby the data line DL and the circuit element in which a defect occurs may be electrically separated from each other. When the data connection line DCL provided in the second laser cutting area LCA2 is cut by laser, as shown in FIG. 9, the first switching transistor TR1 is electrically separated from the data line DL, so that the data voltage Vdata is not applied from the data line DL. The capacitor Cst may not be charged with the data voltage Vdata, and the driving transistor DTR may not be turned on. Therefore, since the first power source EVDD applied from the pixel power line VDDL is not transferred to the anode electrode of the light emitting element OLED, the light emitting element OLED may not emit light. That is, at least one subpixel SP1, SP2, SP3 or SP4 that includes a defective circuit element may become a dark spot through repair.

As described above, in the transparent display panel 110 according to another embodiment of the present disclosure, the data connection line DCL as well as the reference connection line RCL may be cut by laser to make sure of repair of a dark spot for at least one subpixel SP1, SP2, SP3 or SP4 in which a defective circuit element is included.

In the transparent display panel 110 according to another embodiment of the present disclosure, the second laser cutting area LCA2 may be disposed between the plurality of subpixels SP1, SP2, SP3 and SP4. That is, in the transparent display panel 110 according to another embodiment of the present disclosure, the second laser cutting area LCA2 may not overlap the first electrode 120 provided in each of the plurality of subpixels SP1, SP2, SP3 and SP4. In the transparent display panel 110 according to another embodiment of the present disclosure, the second laser cutting area LCA2 does not overlap the first electrode 120 so that the data connection line DCL may be cut by laser without damage of the first electrode 120.

Also, in the transparent display panel 110 according to another embodiment of the present disclosure, at least part of the second laser cutting area LCA2 may overlap the black matrix BM. Therefore, in the transparent display panel 110 according to another embodiment of the present disclosure, the data connection line DCL may be cut by laser without loss of an aperture ratio.

Further, in the transparent display panel 110 according to another embodiment of the present disclosure, the subpixels in which the light emission areas EA have similar sizes may be disposed to be adjacent to each other in the second direction (e.g., X-axis direction). For example, the light emission areas of the first subpixel SP1 and the third subpixel SP3, which are disposed to be adjacent to each other in the second direction (e.g., X-axis direction), may be larger in size than those of the second subpixel SP2 and the fourth subpixel SP4. Among the four subpixels SP1, SP2, SP3 and SP4, two subpixels SP1 and SP3 of which light emission areas are large in size may be disposed to be adjacent to each other in the second direction (e.g., X-axis direction). Also, among the four subpixels SP1, SP2, SP3 and SP4, two subpixels SP2 and SP4 of which light emission areas are small in size may be disposed to be adjacent to each other in the second direction (e.g., X-axis direction).

When the subpixels SP1, SP2, SP3 and SP4 are disposed as described above, the scan line SCANL may be asymmetric as shown in FIG. 7. In detail, the scan line SCANL may include a first line L1, a second line L2 and a third line L3. The first line L1 may cross a first transmissive area TA. That is, the first line L1 may be disposed to be adjacent to the transmissive area TA in the first direction (e.g., Y-axis direction). The second line L2 may be diverged from the first line L1 and thus disposed to at least partially overlap the first subpixel SP1 and the third subpixel SP3. The third line L3 may be diverged from the first line L1 and thus disposed to at least partially overlap the second subpixel SP2 and the fourth subpixel SP4. At this time, the second line L2 and the third line L3 may be asymmetric based on the first line L1.

In addition, when the subpixels SP1, SP2, SP3 and SP4 are disposed as described above, a black matrix disposed between the first subpixel SP1 and the second subpixel SP2 and a black matrix disposed between the third subpixel SP3 and the fourth subpixel SP4 may constitute a straight line. Therefore, in the transparent display panel 110 according to another embodiment of the present disclosure, at least part of the second laser cutting area LCA2 of the data connection lines DCL1, DCL2, DCL3 and DCL4 may overlap the black matrix constituting a straight line. Since at least two adjacent data connection lines of the data connection lines DCL1, DCL2, DCL3 and DCL4 may be cut by laser in a straight line, the transparent display panel 110 according to another embodiment of the present disclosure may facilitate cutting and shorten a repair time.

Figure 11:
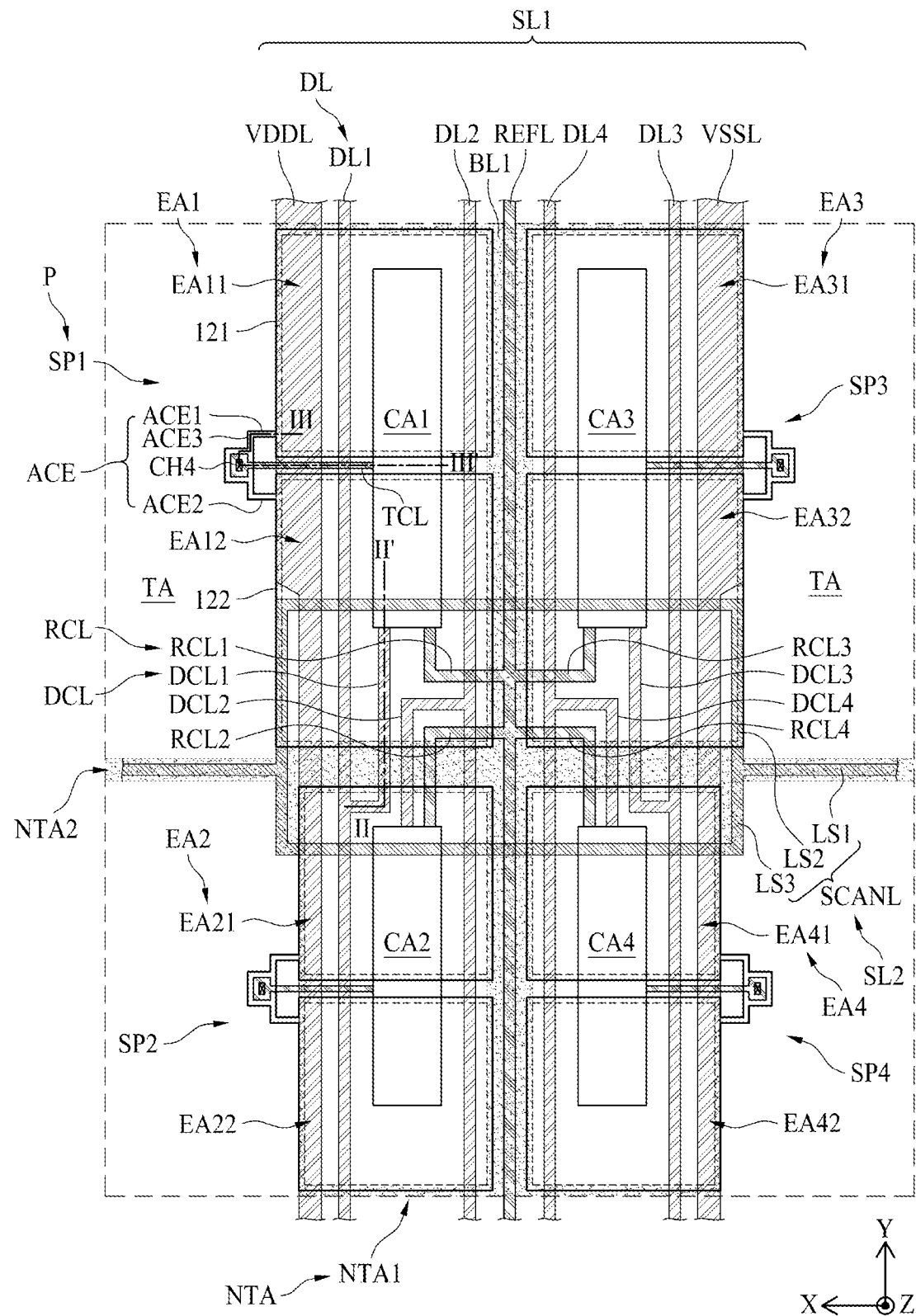
FIG. 11 is a view illustrating a third embodiment of a plurality of subpixels and a plurality of signal lines, which are provided in an area B of FIG. 2.
Figure 12:
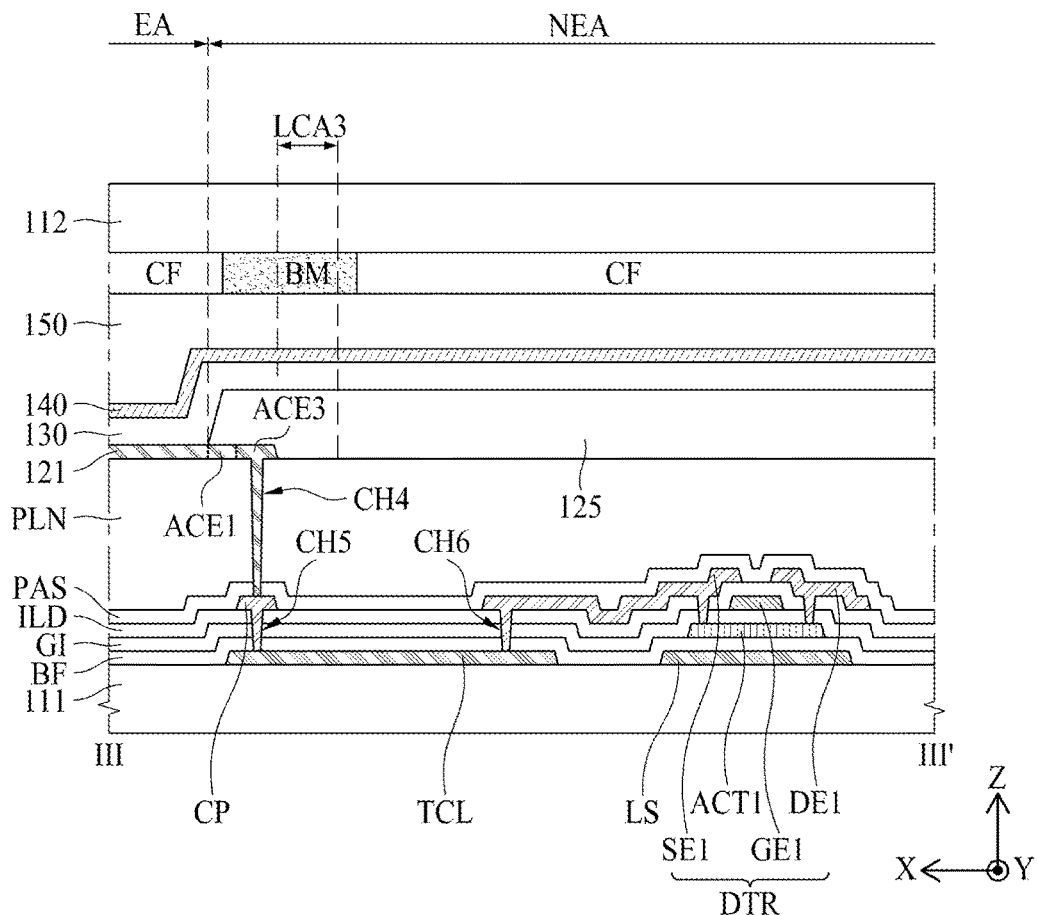
FIG. 12 is a cross-sectional view illustrating an example of line III-III' of FIG. 11.
Figure 13:
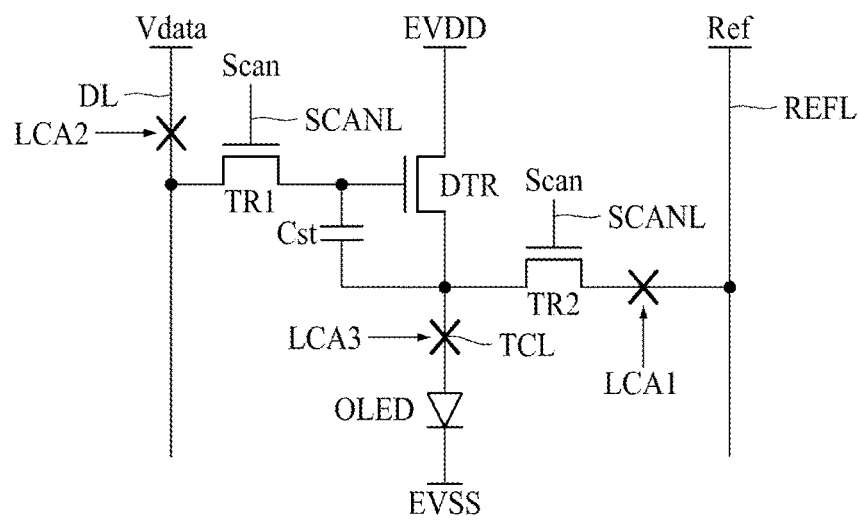
FIG. 13 is a circuit view illustrating a laser cutting area when a defect occurs in a subpixel of FIG. 11.
Figure 14:
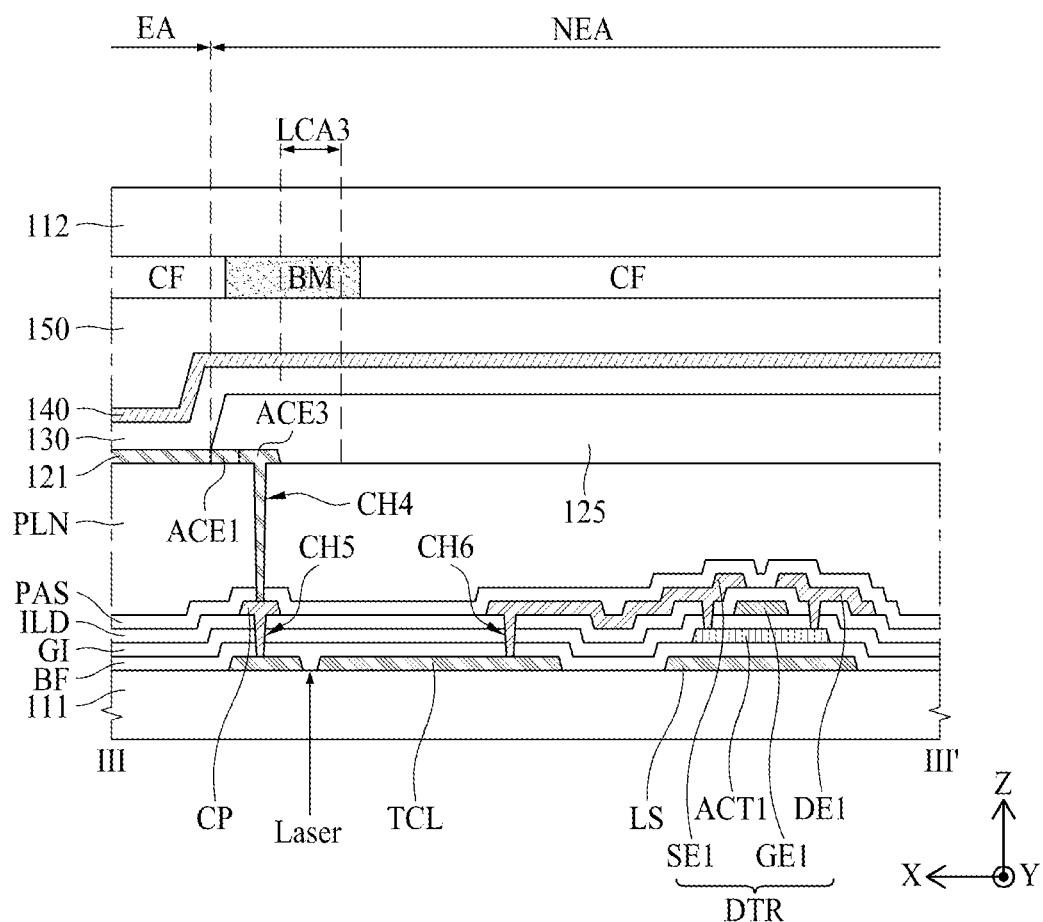
FIG. 14 is a view illustrating an example that a transistor connection line is cut by laser when a defect occurs in a subpixel of FIG. 11.

FIG. 11 is a view illustrating a third embodiment of a plurality of subpixels and a plurality of signal lines, which are provided in an area B of FIG. 2, and FIG. 12 is a cross-sectional view illustrating an example of line III-III' of FIG. 11. FIG. 13 is a circuit view illustrating a laser cutting area when a defect occurs in a subpixel of FIG. 11, and FIG. 14 is a view illustrating an example that a transistor connection line is cut by laser when a defect occurs in a subpixel of FIG. 11.

The transparent display panel 110 shown in FIGS. 11 to 14 is different from the transparent display panel 110 shown in FIGS. 3 to 6 and the transparent display panel 110 shown in FIGS. 7 to 10 in that a transistor connection line TCL is provided. Hereinafter, the description will be based on differences from the transparent display panel 110 shown in FIGS. 3 to 6 and the transparent display panel 110 shown in FIGS. 7 to 10, and a detailed description except the transistor connection line TCL will be omitted.

Referring to FIGS. 11 to 14, in the transparent display panel 110 according to another embodiment of the present disclosure, when a defect occurs in a portion of the circuit elements, the reference line REFL may be electrically separated from the circuit element in which a defect occurs, whereby the defective subpixel may be repaired. Since the case that the reference line REFL is electrically separated from the circuit element in which a defect occurs is substantially the same as that described with reference to FIGS. 3 to 6, its detailed description will be omitted.

Also, in the transparent display panel 110 according to another embodiment of the present disclosure, when a defect occurs in a portion of the circuit elements, the data line DL may be electrically separated from the circuit element in which a defect occurs, whereby the defective subpixel may be repaired. Since the case that the data line DL is electrically separated from the circuit element in which a defect occurs is substantially the same as that described with reference to FIGS. 7 to 10, its detailed description will be omitted.

Also, in the transparent display panel 110 according to another embodiment of the present disclosure, when a defect occurs in a portion of the circuit elements, the driving transistor DTR may be electrically separated from the light emitting element in which a defect occurs, whereby the defective subpixel may be repaired.

In detail, the transparent display panel 110 according to another embodiment of the present disclosure may include a transistor connection line TCL for connecting the first electrode 120 with the driving transistor DTR. In the transparent display panel 110 according to another embodiment of the present disclosure, the first electrode 120 includes a first divided electrode 121 and a second divided electrode 122, and the first and second divided electrodes 121 and 122 may be connected to each other through an anode connection electrode ACE.

The anode connection electrode ACE may include a first anode connection electrode ACE1, a second anode connection electrode ACE2 and a third anode connection electrode ACE3, as shown in FIG. 11. The first anode connection electrode ACE1 may be extended from the first divided electrode 121 toward the transmissive area TA as much as a predetermined length. The second anode connection electrode ACE2 may be extended from the second divided electrode 122 toward the transmissive area TA as much as a predetermined length. The third anode connection electrode ACE3 may connect one end of the first anode connection electrode ACE1 with one end of the second anode connection electrode ACE2. The first anode connection electrode ACE1, the second anode connection electrode ACE2 and the third anode connection electrode ACE3 may be integrally provided on the same layer as the first and second divided electrodes 121 and 122. Therefore, the first divided electrode 121 may be electrically connected to the second divided electrode 122 through the anode connection electrode ACE.

The first divided electrode 121 and the second divided electrode 122 may be electrically connected to the driving transistor DTR through the anode connection electrode ACE and the transistor connection line TCL. One end of the transistor connection line TCL may at least partially overlap the driving transistor DTR, and the other end thereof may overlap the anode connection electrode ACE. The transistor connection line TCL may be connected to the source electrode SE1 or the drain electrode DE1 of the driving transistor DTR at one end through the sixth contact hole CH6. In FIG. 12, the transistor connection line TCL is connected to the source electrode SE1 of the driving transistor DTR through the sixth contact hole CH6, but is not limited thereto. The transistor connection line TCL may be extended from the source electrode SE1 of the driving transistor DTR.

The transistor connection line TCL may be extended in a direction of the transmissive area TA as much as a predetermined length, and may be connected to the anode connection electrode ACE, particularly the third anode connection electrode ACE3 at the other end through a fourth contact hole CH4. The transistor connection line TCL may be connected to the third anode connection electrode ACE3 through a separate connection pattern CP. The transistor connection line TCL may be disposed on the same layer as the light shielding layer LS, and the connection pattern CP may be disposed between the transistor connection line TCL and the third anode connection electrode ACE3. The connection pattern CP may be connected to the transistor connection line TCL through a fifth contact hole CH5, and the third anode connection electrode ACE3 may be connected to the connection pattern CP through a fourth contact hole CH4. In FIG. 12, the transistor connection line TCL is shown as being connected to the third anode connection electrode ACE3 through the connection pattern CP, but is not limited thereto. In another embodiment, the transistor connection line TCL may be directly connected to the third anode connection electrode ACE3.

The transistor connection line TCL may include a third laser cutting area LCA3 between the transmissive area TA and the plurality of subpixels SP1, SP2, SP3 and SP4. In the transparent display panel 110 according to another embodiment of the present disclosure, when a defect occurs in a portion of the circuit elements, the transistor connection line TCL of the third laser cutting area LCA3 may be cut by laser as shown in FIG. 14, whereby the circuit element in which a defect occurs may be electrically separated from the light emitting element OLED. When the transistor connection line TCL provided in the third laser cutting area LCA3 is cut by laser, as shown in FIG. 13, the driving transistor DTR may be electrically separated from the light emitting element OLED. Therefore, since the first power source EVDD applied from the pixel power line VDDL is not transferred to the anode electrode of the light emitting element OLED, the light emitting element OLED may not emit light. That is, at least one subpixel SP1, SP2, SP3 or SP4 that includes a defective circuit element may become a dark spot through repair.

As described above, in the transparent display panel 110 according to another embodiment of the present disclosure, the transistor connection line TCL as well as the reference connection line RCL and the data connection line DCL may be cut by laser to make sure of repair of a dark spot for at least one subpixel SP1, SP2, SP3 or SP4 in which a defective circuit element is included.

In the transparent display panel 110 according to another embodiment of the present disclosure, the third laser cutting area LCA3 may be disposed between the transmissive area TA and the plurality of subpixels SP1, SP2, SP3 and SP4. That is, in the transparent display panel 110 according to another embodiment of the present disclosure, the third laser cutting area LCA3 may not overlap the first electrode 120 and the anode connection electrode ACE, which are provided in each of the plurality of subpixels SP1, SP2, SP3 and SP4. In the transparent display panel 110 according to another embodiment of the present disclosure, the third laser cutting area LCA3 does not overlap the first electrode 120 and the anode connection electrode ACE, so that the transistor connection line TCL may be cut by laser without damage of the first electrode 120 and the anode connection electrode ACE.

Also, in the transparent display panel 110 according to another embodiment of the present disclosure, the third laser cutting area LCA3 may overlap at least part of the black matrix BM. Therefore, in the transparent display panel 110 according to another embodiment of the present disclosure, the transistor connection line TCL may be cut by laser without loss of an aperture ratio.

According to the present disclosure, the following advantageous effects may be obtained.

In the present disclosure, the first laser cutting area cut by laser through a repair process when a defective circuit element occurs may be provided in the reference connection line connecting the reference line with the plurality of subpixels. In this case, since the first laser cutting area does not overlap the first electrode, the reference connection line may be cut by laser without damage to the first electrode.

Further, in the present disclosure, the first laser cutting area is disposed to overlap at least part of the black matrix, the reference connection line may be cut by laser without loss of an aperture ratio and transmittance.

Also, in the present disclosure, the second laser cutting area cut by laser through a repair process when a defective circuit element occurs may be provided in the data connection line connecting the data line with the plurality of subpixels. In this case, since the second laser cutting area does not overlap the first electrode, the data connection line may be cut by laser without damage to the first electrode.

Also, in the present disclosure, the second laser cutting area is disposed to overlap at least part of the black matrix, so that the data connection line may be cut by laser without loss of an aperture ratio and transmittance. Further, in the present disclosure, the data connection lines connected to each of the plurality of subpixels may be disposed in parallel in the area overlapped with the black matrix provided in a straight line. According to the present disclosure, when at least two adjacent data connection lines are cut by laser, cutting may be performed in a straight line, whereby cutting may be facilitated and a repair time may be shortened. Therefore, the present disclosure may improve productivity of the transparent display panel.

Also, in the present disclosure, the data connection line as well as the reference connection line may be cut by laser to make sure of repair of the dark spot for at least one subpixel that includes a defective circuit element.

It will be apparent to those skilled in the art that the present disclosure described above is not limited by the above-described embodiments and the accompanying drawings and that various substitutions, modifications and variations can be made in the present disclosure without departing from the spirit or scope of the disclosures. It is intended that all variations or modifications derived from the meaning, scope and equivalent concept of the embodiments specifically described herein fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
    a substrate provided with a transmissive area and a non-transmissive area;
    a plurality of subpixels provided in the non-transmissive area, each of the plurality of subpixels including a first electrode, a light emitting layer and a second electrode;
    a reference line extending in the non-transmissive area in a first direction, the reference line configured to receive a reference voltage; and a plurality of reference connection lines connected to the reference line, configured to transfer the reference voltage to each of the plurality of subpixels,
wherein each of the plurality of reference connection lines includes a first laser cutting area disposed between subpixels of the plurality of subpixels.

2. The transparent display device of claim 1, wherein the first laser cutting area offsets from the first electrode of the respective one of the plurality of subpixels.

3. The transparent display device of claim 1, wherein the first laser cutting area is disposed between two subpixels disposed to be adjacent to each other in a second direction.

4. The transparent display device of claim 1, further comprising:
a plurality of color filters provided over the second electrode and disposed to respectively correspond to subpixels of the plurality of subpixels; and
a black matrix provided among the plurality of color filters,
wherein at least part of the first laser cutting area overlaps the black matrix.

5. The transparent display device of claim 1, further comprising:
a plurality of data lines extending in the non-transmissive area in the first direction, configured to receive a data voltage; and
a plurality of data connection lines respectively connected to the plurality of data lines, configured to transfer the data voltage to each of the plurality of subpixels,
wherein each of the plurality of data connection lines includes a second laser cutting area disposed between subpixels of the plurality of subpixels.

6. The transparent display device of claim 5, wherein the second laser cutting area is disposed between two subpixels disposed to be adjacent to each other in the first direction.

7. The transparent display device of claim 6, wherein one end of each of the plurality of data connection lines overlaps one of the two subpixels disposed to be adjacent to each other in the first direction and another end of the data connection line overlaps another one of the two subpixels.

8. The transparent display device of claim 5, wherein each of the plurality of data connection lines extends from the second laser cutting area in the first direction.

9. The transparent display device of claim 1, wherein the first electrode includes a first divided electrode, a second divided electrode, and an anode connection electrode connecting the first divided electrode with the second divided electrode, and
the anode connection electrode includes a first anode connection electrode protruding from the first divided electrode toward the transmissive area, a second anode connection electrode protruding from the second divided electrode toward the transmissive area, and a third anode connection electrode connecting the first anode connection electrode with the second anode connection electrode.

10. The transparent display device of claim 9, further comprising a transistor connection line connecting the anode connection electrode to a driving transistor,
wherein the transistor connection line includes a third laser cutting area disposed between the transmissive area and the plurality of subpixels.

11. A transparent display device comprising:
a substrate provided with a transmissive area and a non-transmissive area;
a first subpixel and a second subpixel, which are disposed to be adjacent to each other in a first direction in the non-transmissive area;
a first data line extending in the non-transmissive area in the first direction, configured to receive a first data voltage;
a second data line extending in the non-transmissive area in the first direction, configured to receive a second data voltage;
a first data connection line connected to the first data line to transfer the first data voltage to the first subpixel; and
a second data connection line connected to the second data line to transfer the second data voltage to the second subpixel,
wherein each of the first data connection line and the second data connection line includes a laser cutting area disposed between the first subpixel and the second subpixel.

12. The transparent display device of claim 11, wherein the first data connection line is connected to one side of the first data line, and the first data connection line overlaps the second subpixel at one end and extends toward the first subpixel, and
the second data connection line is connected to one side of the second data line, and the second data connection line overlaps the first subpixel at one end and extends toward the second subpixel.

13. The transparent display device of claim 11, further comprising:
a third subpixel disposed to be adjacent to the first subpixel in a second direction;
a fourth subpixel disposed to be adjacent to the second subpixel in the second direction;
a third data line extending in the non-transmissive area in the first direction, configured to receive a third data voltage;
a fourth data line extending in the non-transmissive area in the first direction, configured to receive a fourth data voltage is applied;
a third data connection line connected to the third data line to transfer the third data voltage to the third subpixel; and
a fourth data connection line connected to the fourth data line to transfer the fourth data voltage to the fourth subpixel,
wherein each of the third data connection line and the fourth data connection line includes a laser cutting area disposed between the third subpixel and the fourth subpixel.

14. The transparent display device of claim 13, wherein the first subpixel includes a light emission area that is larger than that of the second subpixel, and the third subpixel includes a light emission area that is larger than that of the fourth subpixel.

15. The transparent display device of claim 13, further comprising a black matrix provided among the first, second, third, and fourth subpixels,
wherein a portion of the black matrix provided between the first subpixel and the second subpixel forms a straight line with a portion of the black matrix provided in the third subpixel and the fourth subpixel.

16. The transparent display device of claim 15, wherein the laser cutting area of each of the first, second, third and fourth data connection lines overlaps the black matrix.

17. The transparent display device of claim 13, wherein the first, second, third and fourth data connection lines are disposed in parallel in an area overlapped with the black matrix.

18. The transparent display device of claim 13, further comprising a scan line extending in the non-transmissive area in the second direction,
- wherein the scan line includes a first line disposed between transmissive areas disposed to be adjacent to each other in the first direction, a second line diverged from the first line and disposed to overlap the first subpixel and the third subpixel, and a third line diverged from the first line and disposed to overlap the second subpixel and the fourth subpixel.

19. The transparent display device of claim 18, wherein the second line and the third line are asymmetric based on the first line.

20. A transparent display device comprising:
- a substrate having a transmissive area and a non-transmissive area;
- a plurality of subpixels in the non-transmissive area, each of the plurality of subpixels including a first electrode, a light emitting layer and a second electrode;
- a black matrix layer adjacent to a subpixel of the plurality of subpixels in the non-transmissive area;
- a voltage signal line in the non-transmissive area, the voltage line configured to receive a voltage signal;
- a voltage signal connection line coupled between the voltage signal line and the subpixel; and
- a laser cutting area that overlaps the black matrix layer.

21. The transparent display device of claim 20 wherein the laser cutting area is within the voltage connection line.

* * * * *